(12) United States Patent
Park et al.

(10) Patent No.: US 8,143,690 B2
(45) Date of Patent: Mar. 27, 2012

(54) SEMICONDUCTOR DEVICE HAVING ELECTROSTATIC DISCHARGE PROTECTION CIRCUIT AND METHOD OF MANUFACTURING THE SAME

(75) Inventors: Myoung-kyu Park, Yongin-si (KR); Byung-sun Kim, Suwon-si (KR); Tae-jung Lee, Yongin-si (KR); Kee-in Bang, Chungcheongbuk-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 328 days.

(21) Appl. No.: 12/219,336

(22) Filed: Jul. 21, 2008

(65) Prior Publication Data

US 2009/0020844 A1 Jan. 22, 2009

(30) Foreign Application Priority Data

Jul. 20, 2007 (KR) .................. 10-2007-0073115

(51) Int. Cl.
*H01L 27/06* (2006.01)

(52) U.S. Cl. ................. 257/476; 257/E27.024

(58) Field of Classification Search .............. 257/476, 257/170, 173, 355, 544, 546, 409, 484, 490, 257/494, 495, E29.012, E29.013
See application file for complete search history.

(56) References Cited

U.S. PATENT DOCUMENTS

| | | | | |
|---|---|---|---|---|
| 4,110,775 A | * | 8/1978 | Festa | 257/484 |
| 4,513,309 A | * | 4/1985 | Cricchi | 257/376 |
| 4,864,378 A | * | 9/1989 | Tsaur | 257/451 |
| 5,338,964 A | * | 8/1994 | Bernier | 257/476 |
| 5,355,014 A | * | 10/1994 | Rao et al. | 257/533 |
| 5,442,217 A | * | 8/1995 | Mimoto | 257/361 |
| 6,097,064 A | * | 8/2000 | Saitoh et al. | 257/345 |
| 6,693,338 B2 | * | 2/2004 | Saitoh et al. | 257/492 |
| 6,936,905 B2 | * | 8/2005 | Wu | 257/484 |
| 7,075,763 B2 | | 7/2006 | Marr | |
| 7,460,345 B2 | * | 12/2008 | Brandl | 361/56 |
| 2005/0078427 A1 | | 4/2005 | Castro | |
| 2006/0244050 A1 | * | 11/2006 | Sudou | 257/324 |

FOREIGN PATENT DOCUMENTS

KR 10-2001-0045565 6/2001

OTHER PUBLICATIONS

Office Action dated Jun. 24, 2011, incorresponding Chinese Patent Application No. 2008101756275.

* cited by examiner

*Primary Examiner* — Andy Huynh
*Assistant Examiner* — David Ziskind
(74) *Attorney, Agent, or Firm* — Harness, Dickey & Pierce, PLC

(57) ABSTRACT

Semiconductor device having an on-chip type electrostatic discharge (ESD) protection circuit and a method of manufacturing the same are provided. The on-chip type ESD protection circuit may include a first junction diode having a first conductive type region contacting a second conductive type region in a semiconductor substrate, and a first schottky diode having a metallic material layer arranged on and contacting the first conductive type region of the semiconductor substrate.

24 Claims, 6 Drawing Sheets

US 8,143,690 B2

SEMICONDUCTOR DEVICE HAVING ELECTROSTATIC DISCHARGE PROTECTION CIRCUIT AND METHOD OF MANUFACTURING THE SAME

PRIORITY STATEMENT

This application claims the benefit of Korean Patent Application No. 10-2007-0073115, filed on Jul. 20, 2007, in the Korean Intellectual Property Office, the disclosure of which is incorporated herein in its entirety by reference.

BACKGROUND

1. Field

Example embodiments relate to a semiconductor device and a method of manufacturing the same, for example, to a semiconductor device having an on-chip type electrostatic discharge (ESD) protection circuit and a method of manufacturing the same.

2. Description of the Related Art

Modern technologies allow computer peripheral devices to be more frequently used. Some computer peripheral devices, for example, electronic communication apparatuses (e.g., Bluetooth) and computer external memory devices (e.g., a flash memory), have high data transfer speeds and various operating voltage ranges. The integrated circuit inside these devices are frequently connected or disconnected to a computer system through external ports. An integrated circuit (IC) directly connected to an external port may receive an unrecoverable damage such as joining failure, contact damage, insulation breakdown, short or opening of a fuse etc. due to an electrostatic discharge (ESD) that flows into the external port. The ESD may be caused by various reasons, for example, inappropriate handling of the IC and inappropriate environmental conditions, such as abnormal operating conditions, and a poor printed circuit board of the IC.

With the development of semiconductor manufacturing process techniques, integration density of ICs is increased, and as a result, pads for signal input/output, line width, or thickness of deposited thin films are reduced. Accordingly, a tolerable current of ICs is also reduced, and thus, ICs are becoming more susceptible to ESD damage.

In order to prevent ICs from being damaged by the ESD, generally an ESD protection circuit is installed between a power source terminal $V_{DD}$ and a ground terminal $V_{SS}$ or an input terminal and an output terminal of an IC. The ESD protection circuit protects the IC by blocking an ESD current from flowing through the IC or by bypassing the ESD current.

Circuits in which zenor diodes, metal oxide varistors (MOVs), or silicon controlled rectifiers (SCRs) are included are conventionally used as the ESD protection circuits. However, these ESD protection circuits do not sufficiently respond to the reduction of tolerance current caused by the increased integration density of the ICs. For example, an ESD protection circuit may not be triggered by a relative small ESD surge, which is no longer safe to more sensitive and/or densely integrated ICs. Also, since the turn-on speed of the ESD protection circuits is slow, the ESD protection circuits themselves may be damaged by an ESD surge.

With the increase in integration density of ICs, there is a need to develop an ESD protection circuit that can respond to various ranges of ESD surges with a quick turn-on response.

SUMMARY

To address the above and/or other problems, example embodiments provide an on-chip type electrostatic discharge (ESD) protection circuit that may protect internal circuits against a wide range of ESD surges from a low voltage region to a high voltage region and that may operate at a high response speed.

Example embodiments also provide a method of manufacturing an on-chip type ESD protection circuit that may protect internal circuits against a wide range of ESD surges from a low voltage region to a high voltage region and that may operate at a high response speed.

According to example embodiments, there is provided a semiconductor device that may include an on-chip type ESD protection circuit. The ESD protection circuit may comprise a first junction diode and a first schottky diode. The first junction diode may have a first conductive type region contacting a second conductive type region in a semiconductor substrate; and a first schottky diode may have a metallic material layer arranged on and contacting the first conductive type region.

The first conductive type may be an N type, and the second conductive type may be a P type. Dopant concentrations of the first conductive type region and the second conductive type region may be determined from the operating range of the ESD protection circuit. The junction diode may be turned on at a forward voltage of about 0.6 to about 0.8 V, and the schottky diode may be turned on at a forward voltage of about 0.2 to about 0.4 V.

The second conductive type region may surround at least a portion of the first conductive type region in a depth direction of the semiconductor substrate to provide a guard ring for the schottky diode. The second conductive type region may include a highly doped second conductive type region, and the first conductive type region may include a highly doped first conductive type region in an upper portion of the first conductive type region. The metallic material layer may extend over at least a portion of the highly doped second conductive type region, and the metallic material layer may include one of a metal and a silicide compound thereof. For example, the metal includes one of Mo, W, Co, Ni and an alloy thereof.

The semiconductor device may further comprise a contact plug electrically connecting the schottky diode to one of a power line and an input/output signal terminal, and the contact plug may not overlap a junction region of the first conductive type region and the metallic material layer.

According to example embodiments, there is provided a semiconductor device that may include an on-chip type ESD protection circuit. The on-chip type ESD protection circuit may comprise a first diode pair arranged in a first device region and a second diode pair arranged in a second device region. The first diode pair may include a first junction diode having a first conductive type region contacting a second conductive type region, and a first schottky diode having a metallic material layer arranged on and contacting the first conductive type region. The second diode pair may include a second junction diode having a first type region contacting a second conductive type region, and a second schottky diode having a metallic material layer arranged on and contacting the first conductive type region.

the first conductive type region of the first device region may be an N type doped region, the second conductive type region of the first device region may be a P type doped region; and the first conductive type region of the second device region may be a P type doped region, the second conductive type region of the second device region may be an N type doped region.

Accordingly, the first diode pair may include anodes electrically connected to an input/output signal terminal and cathodes electrically connected to a first power line; and the second diode pair may include anodes electrically connected to a second power line and cathodes electrically connected to the input/output signal terminal.

Alternatively, the first conductive type region of the first device region may be an N type doped region, the second conductive type region of the first device region may be a P type doped region; and the first conductive type region of the second device region may be an N type doped region, the second conductive type region of the second device region may be a P type doped region.

Accordingly, the first diode pair may include anodes electrically connected to an input/output signal terminal and cathodes electrically connected a first power line, and the second diode pair may include anodes electrically connected to a second power line and cathodes electrically connected to the input/output signal terminal.

At least one of the second conductive type regions may surround at least a portion of the corresponding first conductive type region in a depth direction of the semiconductor substrate to provide a guard ring for a corresponding schottky diode.

At least one of the first device region and the second device region may include a highly doped second conductive type region in an upper portion of the second conductive type region. At least one of the metallic material layers of the first device region and the second device region may extend over at least a portion of the corresponding highly doped second conductive type region.

At least one of the first device region and the second device region may include a highly doped first conductive type region in an upper portion of the first conductive type region.

At least one of the metallic material layers of the first device region and the second device region may include one of a metal and a silicide compound thereof. For example, the metal of the metallic layer may include one of Mo, W, Co, Ni and an alloy thereof.

The semiconductor device may further comprise a contact plug electrically connecting the schottky diode for at least one of the first and second device region to one of a power line and an input/output signal terminal, the contact plug may not overlap a junction region of the first conductive type region and the metallic material layer.

The junction diode of at least one of the first and second device regions may be turned on at a forward voltage of about 0.6 to about 0.8V, and the schottky diode may be turned on at a forward voltage of about 0.2 to about 0.4V.

According to example embodiments, there is provided a method of manufacturing a semiconductor device that may comprise an on-chip type ESD protection circuit. The method may comprise providing a first conductive type region in a semiconductor substrate; providing a junction diode by forming a second conductive type region contacting with the first conductive type region; and providing a schottky diode by forming a metallic material layer on the first conductive type region.

The first conductive type may be an N type, and the second conductive type may be a P type. Dopant concentrations of the first conductive type region and the second conductive type region may be determined from the operating range of the ESD protection circuit. For example, the junction diode may be turned on at a forward voltage of about 0.4 to about 0.9 V, and the schottky diode may be turned on at a forward voltage of about 0.2 to about 0.4 V.

The method may further comprise forming a highly doped second conductive type region in an upper portion of the second conductive type region after formation of the second conductive type region. The formed metallic material layer extends over at least a portion of the second conductive type region.

The metallic material layer may include a metal or a silicide compound thereof. For example, the metal may include one of Mo, W, Co, Ni and an alloy thereof.

BRIEF DESCRIPTION OF THE DRAWINGS

The above and other features and advantages will become more apparent by describing in detail example embodiments with reference to the attached drawings in which.

DETAILED DESCRIPTION OF EXAMPLE EMBODIMENTS

Figure 1:
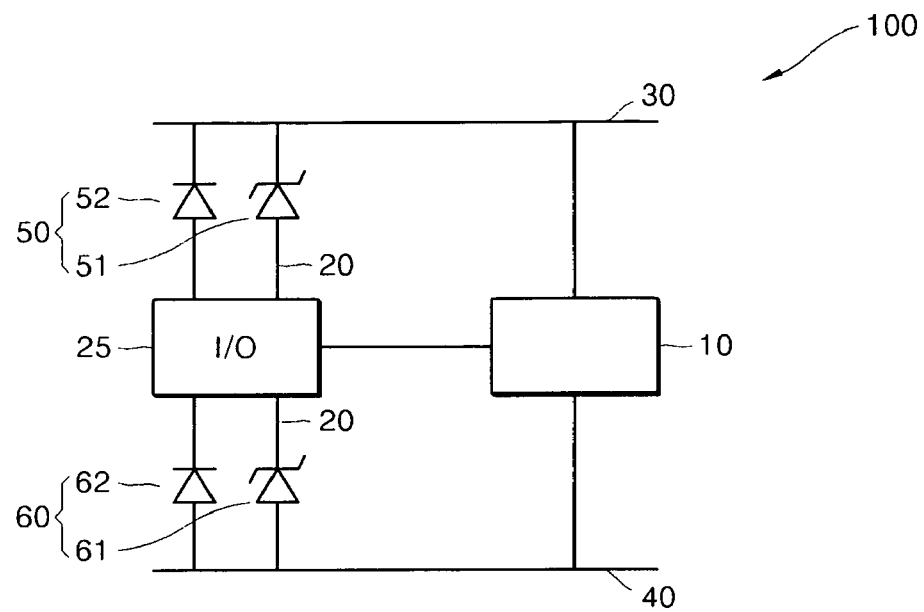
FIG. 1 is a schematic view of an electrostatic discharge (ESD) protection circuit according to an example embodiment.

Example embodiments will now be described more fully with reference to the accompanying drawings.

Specific structural and functional details disclosed herein may, however, be embodied in many different forms and should not be construed as being limited to example embodiments set forth herein; rather, these example embodiments are provided so that this disclosure will be thorough and complete, and will fully convey the concepts of this disclosure to those skilled in the art.

It will also be understood that when a layer is referred to as being "on" another layer or substrate, it may be directly on the other layer or substrate, or intervening layers may be present. In the drawings, the thicknesses of layers and regions are exaggerated for clarity. Like reference numerals in the drawings denote like elements. The term "and/or" as used in the present specification comprises one of corresponding listed items and at least one of all combinations.

Terminologies used in the present specification are used to explain an example embodiment, and are not intended to limit the example embodiments of this specification. As used in the present specification, a singular form can include a plural form if it is not contextually indicated. Also, the terms "comprise" and/or "comprising" specify shapes, numbers, steps, operations, members, elements described, and/or the existence of these groups, and do not exclude different shapes, numbers, operations, members, elements more than one, and/or the existence and addition of these groups.

In the present specification, the terms of first and second are used to explain various members, parts, regions, layers, and/or portions, however, it is clearly understood that the members, parts, regions, layers, and/or portions are not limited to the terms. These terms are only used to distinguish one member, part, region, layer, and/or portion from another member, part, region, layer, or portion. Accordingly, a first member, part, region, layer, and/or portion can indicate a second member, part, region, layer, or a portion without departing from the scope of example embodiments.

In the drawings, the shapes of the drawing can be modified, for example, according to manufacturing techniques and/or tolerance. Thus, example embodiments should not be interpreted as limited to the particular shapes depicted in the drawing of the present specification, and, for example, should include the change of shapes caused by a manufacturing process.

FIG. 1 is a schematic view of an ESD protection circuit 100 according to an example embodiment.

Referring to FIG. 1, an internal circuit 10 may be electrically connected to a signal line 20 and a first and a second power line 30 and 40 that supply power to the internal circuit 10. The signal line 20 may be connected to an input/output signal terminal 25 for transmitting signals between an external circuit (not shown) and the internal circuit 10. The first power line 30 and the second power line 40 may be electrically connected to a power voltage source and a ground, respectively. The ESD protection circuit 100 may include a first diode pair 50 in which a first schottky barrier diode 51 and a first junction diode 52 may be connected in parallel and a second diode pair 60 in which a second schottky barrier diode 61 and a second junction diode 52 may be connected in parallel.

Referring to FIG. 1, a cathode of the first diode pair 50 may be electrically connected to the first power line 30, and an anode of the first diode pair 50 may be electrically connected to the signal line 20. A cathode of the second diode pair 60 may be electrically connected to the signal line 20, and an anode of the second diode pair 60 may be electrically connected to the second power line 40.

For example, when a positive ESD surge is generated at the input/output signal terminal 25, electric potential of the input/output signal terminal 25 will be increased, as a result, the first diode pair 50 connected between the input/output signal terminal 25 and the first power line 30 may be forward biased, and thus, the positive ESD surge may be discharged through the first power line 30. As a result, the internal circuit 10 may be protected from the positive ESD surge.

For example, when a negative ESD surge is generated at the input/output signal terminal 25, the potential of the input/output signal terminal 25 will be decreased, as a result, the second diode pair 60 connected between the input/output signal terminal 25 and the second power line 40 may be forward biased, and thus, the negative ESD surge may be discharged through the second power line 40. As a result, the internal circuit 10 may be protected from the negative ESD surge.

Figure 2A:
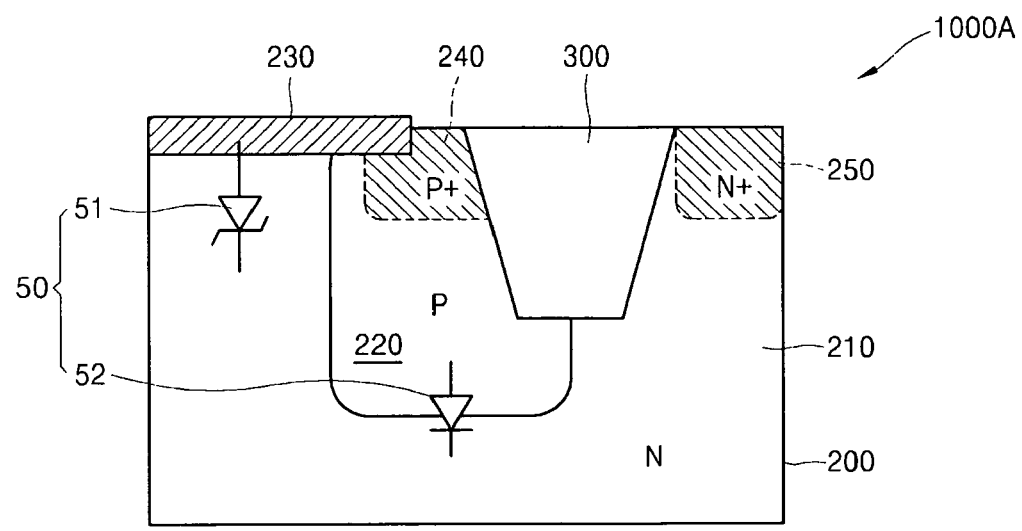
FIGS. 2A and 2B are cross-sectional views of a diode pair for an on-chip type ESD protection circuit, according to example embodiments.
Figure 2B:
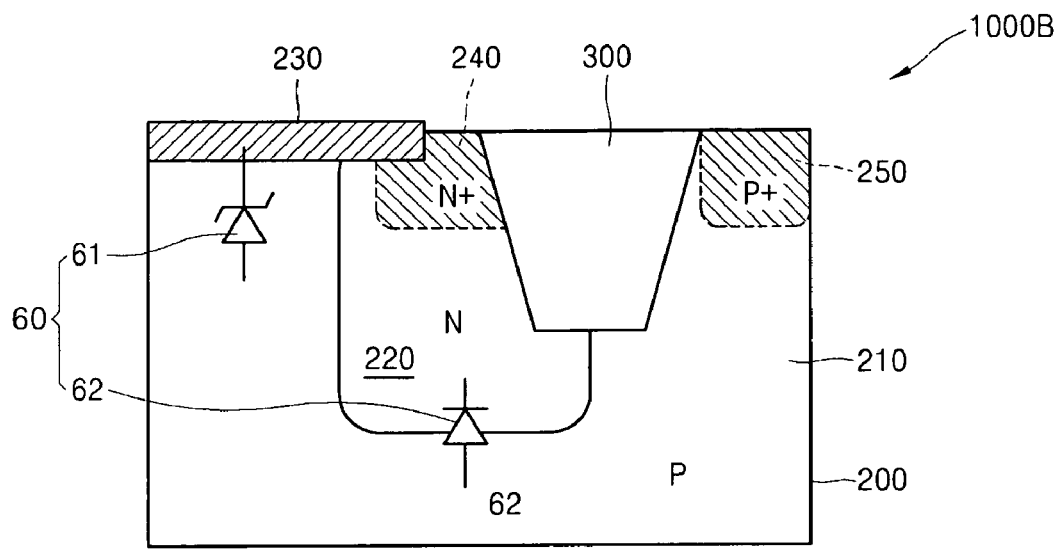

FIGS. 2A and 2B are cross-sectional views of a diode pair 1000A and 1000B, respectively, for an on-chip type ESD protection circuit, according to example embodiments.

Referring to FIG. 2A, the semiconductor devices 1000A may include a semiconductor substrate 200. The semiconductor substrate 200 may further include a first conductive type region 210, a second conductive type region 220 that contacts the first conductive type region 210, and a metallic material layer 230 formed on the first and second conductive type regions 210 and 220. Therefore, a junction diode 52 may be formed between the first conductive type region 210 and the second conductive type region 220, and a schottky diode 51 may be formed between the first conductive type region 210 and the metallic material layer 230.

The semiconductor substrate 200 may be formed of silicon, and schottky diode 51 with various turn-on voltages may be formed by depositing the metallic material layer 230 with an appropriately selected metal or silicide compound of metals. For example, the metallic material layer 230 may be one of a metal of Mo, W, Co, Ni, an alloy of these metals, or a silicide compound of these metals. The silicide compound may improve a leakage current characteristic of the schottky diodes 51 and 61, and the metal and the silicide compound of the metals may have work functions different from each other. Therefore, schottky diodes 51 and 61 may be provided by forming the metallic material layer 230 with an appropriately selected metal or silicide compound of the metals.

The concentration of the dopant of the first conductive type region 210 and the second conductive type region 220 may be determined in consideration of operating range of the ESD protection circuit. For example, The concentration of the first conductive type region 210 and the second conductive type region 220 may be determined so that the schottky diode 51 can be turned on with a forward voltage of 0.2 to 0.4 V, and the junction diode 52 can be turned on with a forward voltage of 0.6 to 0.8V.

Referring to FIG. 2A, the second conductive type region 220 may surround at least a portion of the first conductive type region 210 in a depth direction of the semiconductor substrate 200, so that the second conductive type region 220 may function as a guard ring to improve a reverse current characteristic of the schottky diode 51. For example, the second conductive type region 220 may be disposed between an anode of the schottky diode 51 and a device isolation film 300, and may surround or be adjacent to a portion of the first conductive type region 210. As a result, the second conductive type region 220 may form the junction diode 52 while performing the guard ring function for the schottky diode 51. Therefore, the width and the shape of the second conductive type region 220 may be designed in consideration of characteristics of both the schottky diode 51 and the junction diode 52, according to an example embodiment.

Further, a layer for ohmic contact may be provided by forming a highly doped second conductive type region 240 in the second conductive type region 220. The metallic material layer 230 may extend over at least a portion of the highly doped second conductive region 240, so as to simultaneously provide a schottky barrier junction for the schottky diode 51 and an ohmic junction for the junction diode 52. The metallic material layer 230 and the highly doped second conductive type region 240 may function as a anode of the diode pair 50.

Also, in order to form an electrode for biasing the first conductive type region 210, a highly doped first conductive type region 250 may be formed, for example, in an upper surface of the first conductive type region 210. In this exemplary embodiment, the highly doped first conductive type region 250 may function as a cathode of the diode pair 50 and the anode and cathode of the diode pair 50 may be spatially separated by the device isolation film 300.

Accordingly, the schottky diode 51 and junction diode 52 may be connected in parallel to each other, and the junction diode 52 and the schottky diode 51 may therefore constitute the diode pair 50 in FIG. 1.

In example embodiments described above, the positions of anode and cathode of the diode pair 50 may depend on the doping type of the first, second and highly doped first and second conductive type regions 210, 220, 240, and 250. For example, as depicted in FIG. 2A, the first and highly doped first conductive type regions 210, 250 are N type doped and the second and the highly doped second conductive type region 220, 240 are P type doped. Accordingly, the diode pair 50 may have the cathode in a lower side of the semiconductor substrate 200 and the anode in an upper side of the semiconductor substrate 200. If, according to an example embodiment depicted in FIG. 2B, the first and the highly doped first conductive type regions 210, 250 are P type doped and the second and the highly doped second conductive type regions 220, 240 are N type doped, then a corresponding diode pair 60, which may include a junction diode 62 and schottky diode 61, may have the anode in the lower side of the semiconductor substrate 200 and the cathode in the upper side of the semiconductor substrate 200.

Next, a method of manufacturing the diode pairs 50 or 60 according to an example embodiment will now be described with reference to FIGS. 2A and 2B.

An active region that includes the first conductive type region 210 may be defined in the semiconductor substrate 200 by a device isolation film 300. For example, the device isolation film 300 may be a shallow trench insulator (STI); the first conductive type region 210 may be of a well shape and may be formed by using the semiconductor substrate 200 having a first conductive type.

The junction diodes 52 and 62 are subsequently formed by forming the second conductive type region 220 in the first conductive type region 210 using an implantation process or an impurity diffusion process, as well known in the art. Next, a layer for ohmic contact may be provided by forming the highly doped second conductive type region 240 in the second conductive type region 220. The schottky diodes 51 and 61 may be formed by depositing the metallic material layer 230 on the first conductive type region 210 of the semiconductor substrate 200 by using a chemical vapor deposition (CVD) method that uses an organic metal compound and SiH4 gas or a physical vapor deposition (PVD) method, e.g., sputtering. The CVD and PVD methods are also well-known techniques in the art.

Next, the metallic material layer 230 may be patterned and formed to be extended over at least a portion of the highly doped second conductive type region 240, so as to simultaneously provide a schottky barrier junction for the schottky diodes 51 and 61 and an ohmic junction for the junction diodes 52 and 62.

In order to form an electrode for biasing the first conductive type region 210, an ion implantation process or an impurity diffusion process may be performed to form a highly doped first conductive type region 250. For example, the highly doped first conductive type region may be formed on an upper surface of the first conductive type region 210.

Example embodiments are not limited to the foregoing process sequence. For example, if necessary, the forming of the highly doped first conductive type region 250 may be performed before the forming of the highly doped second conductive type region 240.

Figure 3:
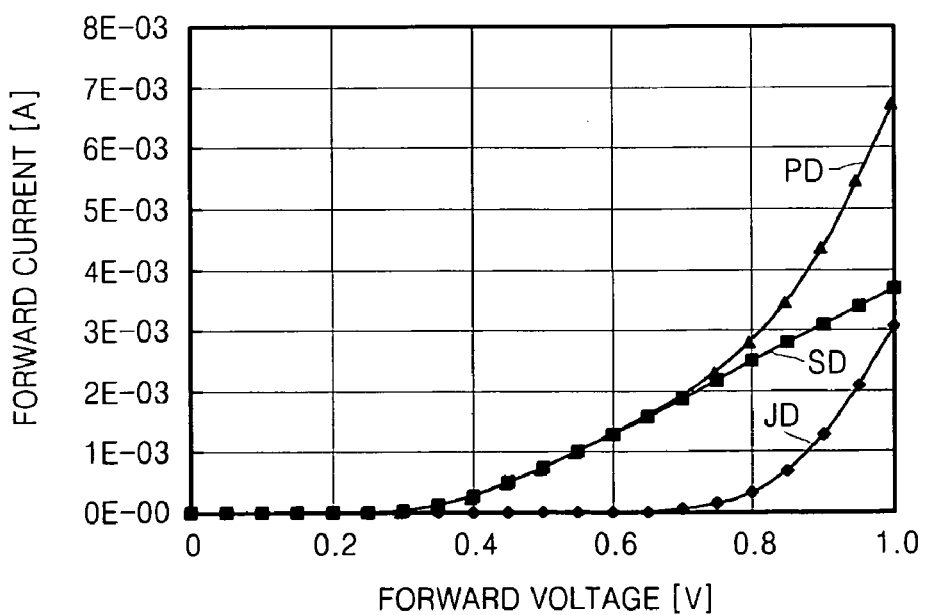
FIG. 3 is a graph showing forwarding characteristics of a diode pair of FIG. 2A.

A forward characteristic of the diode pair 50 manufactured according to the method described above will now be described with reference to FIG. 3. FIG. 3 is a graph showing a forward characteristic of a diode pair 50 depicted in FIG. 2A, according to an example embodiment. Curve JD indicates an I-V characteristic of a junction diode, curve SD indicates an I-V characteristic of a schottky diode, and curve PD indicates an I-V characteristic of the diode pair 50 according to an example embodiment.

Referring to FIG. 3, the schottky diode is turned on at approximately 0.3V, and the junction diode is turned on at a voltage of approximately 0.7V which is higher than the turn-on voltage of the schottky diode. The schottky diode has a turn-on voltage less than that of the junction diode since the schottky diode has a built-in potential less than that of the junction diode at an equilibrium state. It can also be inferred that, after turning-on, the schottky diode has a lower current driving capability at high-voltage regions compared to the junction diode.

However, as indicated by the curve PD, the diode pair 50 according to example embodiments is turned on at a lower voltage (e.g., 0.3V) than the junction diode due to the contribution of the schottky diode and also has a higher current driving capability at a higher voltage than the schottky diode due to the contribution of the junction diode. Similar to the diode pair 50, the diode pair 60 may have a similar forward characteristic. Accordingly, an ESD protection circuit implemented by the diode pair 50 according to example embodiments may have a relatively wide range of ESD protection capability as the ESD protection circuit may effectively remove the ESD surge at a low voltage range and also has a large current driving capability at a high voltage range.

In addition, according to example embodiments, the ESD protection circuit may quickly respond to an ESD surge, as the schottky diodes 51 and 61 may be turned on at a high speed. Also, when the magnitude of the ESD surge is relatively large, electric breakdown resistance of the ESD protection circuit against an excess current may be increased as the excess current may be divided to flow in the junction diode and the schottky diode, respectively.

Figure 4A:
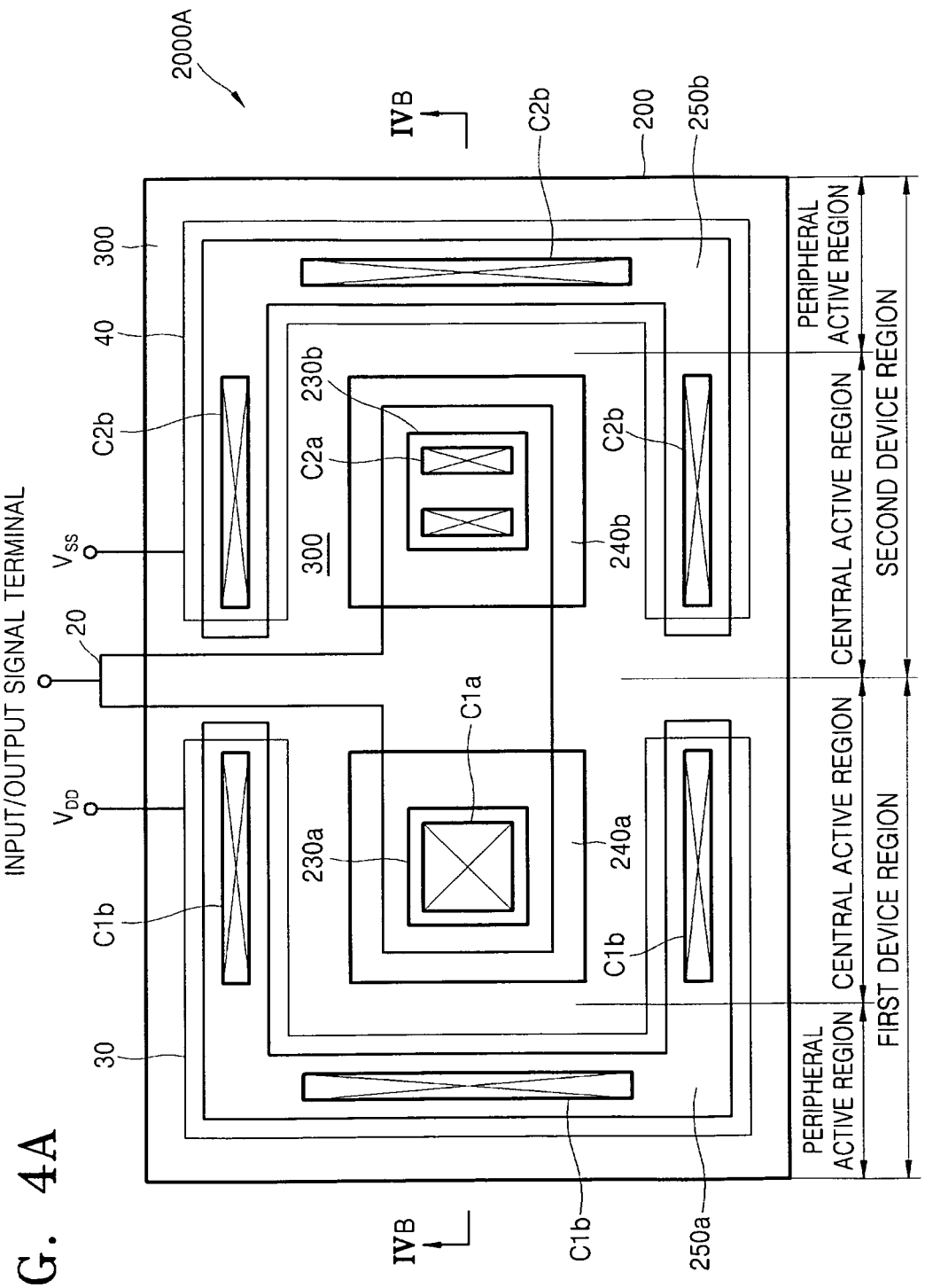
FIG. 4A is a layout of a semiconductor device in which an on-chip type ESD protection circuit corresponding to FIG. 1 is implemented, according to an example embodiment.
Figure 4B:
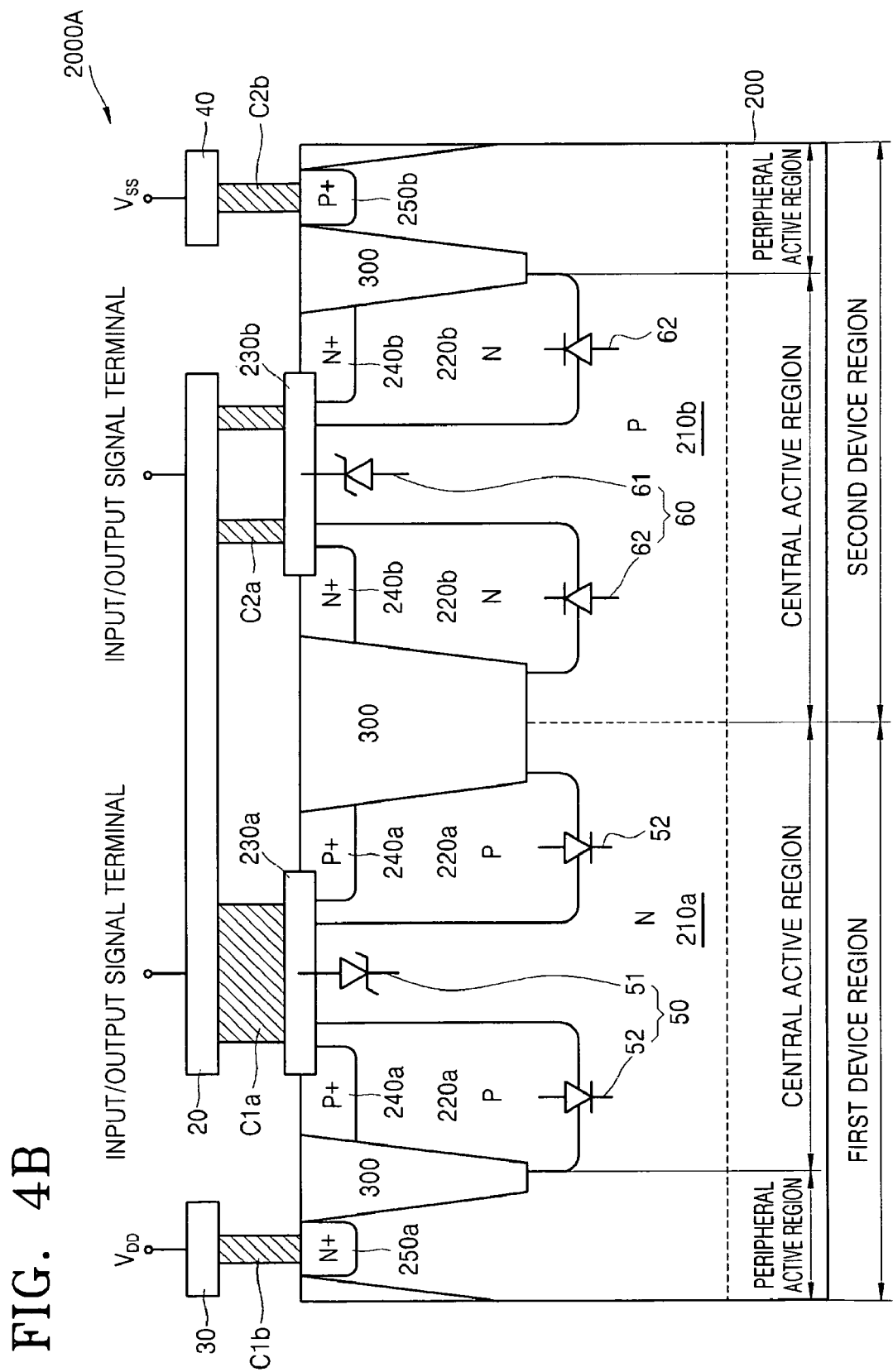
FIG. 4B is a cross-sectional view taken along line IVB-IVB of the semiconductor device of FIG. 4A.

FIG. 4A is a layout of a semiconductor device 2000A in which an on-chip type ESD protection circuit 100 corresponding to FIG. 1 is implemented, according to an example embodiment. FIG. 4B is a cross-sectional view taken along a line IVB-IVB of the semiconductor device 2000A of FIG. 4A.

Referring to FIGS. 4A and 4B, an active region may include a first device region, where the first diode pair 50 of the ESD protection circuit 100 may be formed, and a second device region, where the second diode pair 60 of the ESD protection circuit 100 may be formed. The first and second active regions may be formed and divided by forming a device isolation film 300 in a semiconductor substrate 200. The first device region may include a central active region, on which an anode of the first diode pair 50 may be formed, and a peripheral active region, on which a cathode of the first diode pair 50 may be formed. The central active region and the peripheral active region may be defined by the device isolation film 300. Similarly, the second device region may include a central active region, on which a cathode of the second diode pair 60 may be formed and a peripheral active region on which an anode of the second diode pair 60 may be formed. The central active region and the peripheral active region may be defined by the device isolation film 300.

In the first device region, a schottky diode 51 may be disposed in the central active region. The schottky diode 51 may include a metallic material layer 230a and a first conductive type region 210a. For example, the first conductive type region 210a may be an N type doped region. In the central active region of the first device region, a junction diode 52 may also be formed by forming a second conductive type region 220a contacting the first conductive type region 210a. For example, the second conductive type region 220a may be a P type well. Accordingly, if the second conductive type region 220a is formed to surround the first conductive type region 210a in a depth direction of the semiconductor substrate 200, a guard ring of the schottky diode 51 may be formed.

An ohmic contact may also be formed in an upper portion of the second conductive type region 220a by forming a highly doped second conductive type region 240a. For example, the highly doped second conductive type region 240a may be a P+ type doped region. The metallic material layer 230a may extend over at least a portion of the second conductive type region 240a, and thus, may provide a schottky barrier junction for the schottky diode 51 and an ohmic junction for the junction diode 52.

The anodes of the first diode pair 50 may be electrically connected to the signal line 20 via contact plugs C1a, and the cathodes of the first diode pair 50 may be electrically connected to the first power line 30 via contact plugs C1b. The first power line 30 may be a $V_{DD}$ line.

Referring to FIGS. 4A and 4B, the contact plug C1a of the schottky diode 51 may be disposed to overlap with a schottky barrier junction region formed between the first conductive type region 210a and the metallic material layer 230a. The contact plug C1a may also be disposed not to overlap with the schottky barrier junction region. For example, the contact plug may also resemble a contact plug C2a of the second device region. According to an empirical result, the contact plug C2a disposed not to overlap with the schottky barrier junction region has a superior leakage current characteristic to the contact plug C1a disposed to overlap with the schottky barrier junction region.

In order to implement cathodes of the first diode pair 50, the highly doped first conductive type region 250a may be formed on an upper surface of the first conductive type region 210a. For example, the highly doped first conductive region may be an N+ doped region. The highly doped first conductive type region 250a and the first power line 30 may be electrically connected to each other via a contact plug C1b.

Referring to FIGS. 4A and 4B, similar to the first device region, a schottky diode 61 may be formed in the second device region. The schottky diode 61 may be implemented by the first conductive type region 210b and the metallic material layer 230b. The first conductive type region may be a P type doped region. In the second device region, a junction diode 62 may also be formed by forming a second conductive type region 220b contacting the first conductive type region 210b. The second conductive type region 220b may be an N type well. A guard ring for the schottky diode 61 may be formed by appropriately selecting the shape and dopant concentration of the second conductive type region 220b as above explained.

Also, an ohmic contact may be provided by forming a highly doped second conductive type region 240b on an upper portion of the second conductive type region 220b. The highly doped second conductive type region 240b may be an N+ doped region. The metallic material layer 230b may be extended over at least a portion of the highly doped second conductive type region 240b.

The cathodes of the second diode pair 60 may be electrically connected to the signal line 20, and the anodes of the second diode pair 60 may be electrically connected to the second power line 40. The second power line 40 may be a $V_{SS}$ line. The cathodes of the second diode pair 60 may be electrically connected to the signal line 20 via contact plugs C2a, and the anodes of the second diode pair 60 may be electrically connected to the second power line 40 via contact plugs C2b.

Referring to FIGS. 4A and 4B, the contact plug C2a may be disposed not to overlap with a schottky barrier junction region formed between the first conductive type region 210b and the metallic material layer 230b. However, example embodiments are not limited thereto. The contact plug C2a, like the contact plug C1a in the first device region, may also be disposed to overlap with the schottky barrier junction region.

In order to implement the anodes of the second diode pair 60, a highly doped first conductive type region 250b may be formed in a top section of the first conductive type region 210b of the semiconductor substrate 200. The highly doped first conductive type region 250b may be a P+ doped region.

The highly concentrated first conductive type region 250b and the second power line 40 may be electrically connected to each other via a contact plug C2b.

Figure 5A:
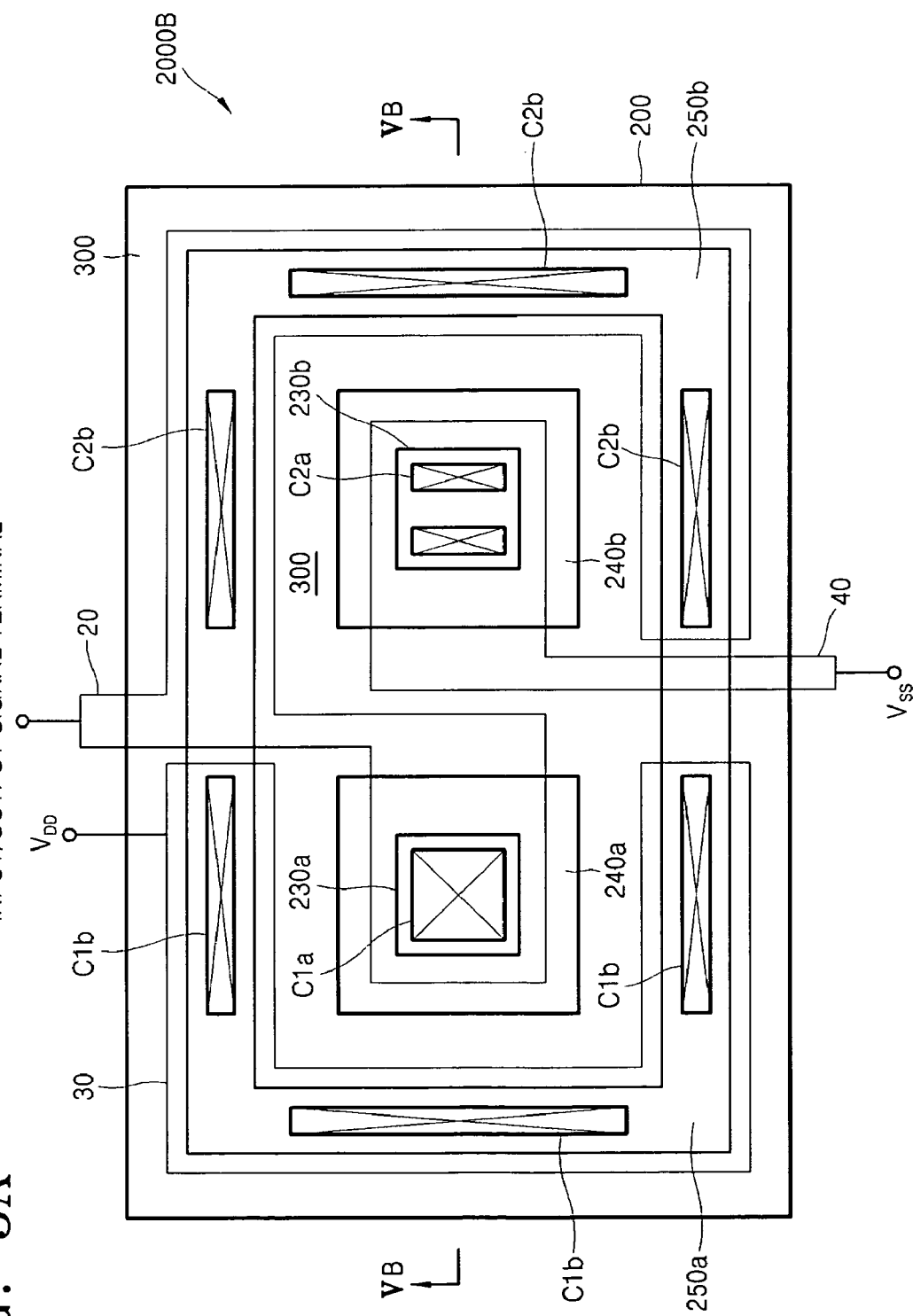
FIG. 5A is a layout of a semiconductor device in which an on-chip type ESD protection circuit corresponding to FIG. 1 is implemented, according to an example embodiment.
Figure 5B:
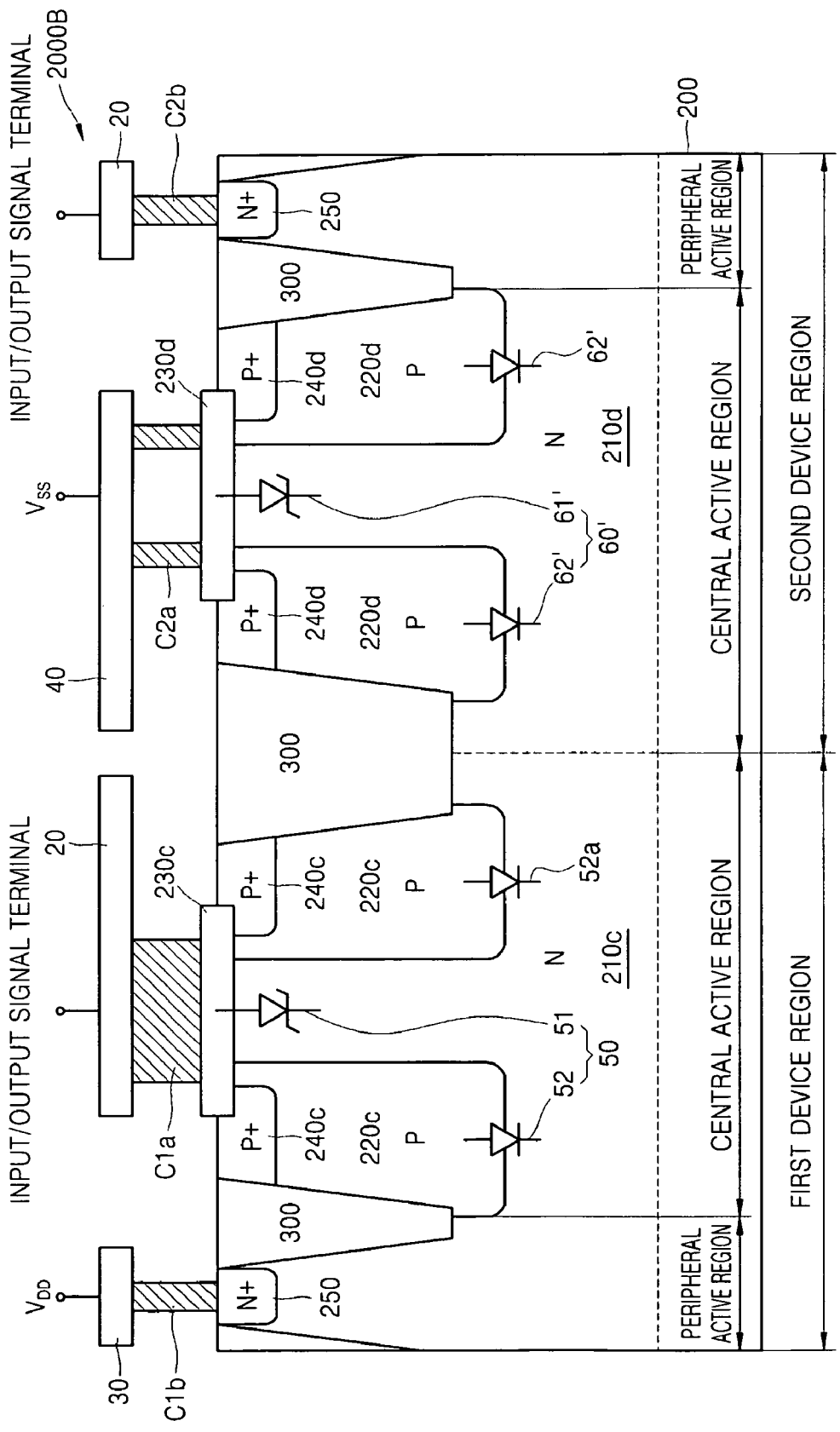
FIG. 5B is a cross-sectional view taken along line VB-VB of the semiconductor device of FIG. 5A.

FIG. 5A is a layout of a semiconductor device 2000B in which an on-chip type ESD protection circuit 100 corresponding to FIG. 1 is implemented according to an example embodiment. FIG. 5B is a cross-sectional view taken along a line VB-VB of the semiconductor device 2000B of FIG. 5A. As experiments show that a schottky diode formed by a junction between a metal and an N type semiconductor provides a superior reliability to a schottky diode formed by a junction between a metal and a P type semiconductor, only schottky diodes formed by a junction between a metal and an N type semiconductor may be included in the ESD protection circuit in FIGS. 5A and 5B.

Referring to FIGS. 5A and 5B, an active region may include a first device region, where a first diode pair 50 may be formed, and a second device region where a second diode pair 60' may be formed. The first and second device region may be defined by forming device isolation films 300 in a semiconductor substrate 200. The first device region may include the first diode pair 50 having the same configuration as the first diode pair 50 described with reference to FIGS. 4A and 4B; whereas the second device region may include a second diode pair 60' having a polarity same as the polarity of the first diode pair 50 of the first device region. Thus, schottky diodes 51 and 61' of the first device region and the second device region may be formed by a junction between metallic material layers 230c and 230d and the first conductive type regions 210c and 210d, respectively. Also, junction diodes 52 and 62' may respectively be formed by junctions between the first conductive type regions 210c and 210d and the second conductive type regions 220c and 220d of the first device region and the second device region, respectively. The first conductive type regions 210c and 210d may be N type doped regions, and the second conductive type regions 220c and 220d may be P type doped regions.

The anodes of the first diode pair 50 may be electrically connected to the signal line 20 via the contact plugs C1a, and the cathodes of the first diode pair 50 may be connected to the first power line 30 via the contact plugs C1b. The anodes of the second diode pair 60' may be connected to the second power line 40 via the contact plugs C2a, and the cathodes of the second diode pair 60' may be connected to the signal line 20 via the contact plugs C2b.

Referring to FIGS. 5A and 5B, an ESD protection circuit that includes only a metal-N type semiconductor schottky diode may be implemented by forming the diode pairs 50 and 60' in the first device region and the second device region. The diode pairs 50 and 60' may be formed on the same type of central active regions (e.g., N type) on a semiconductor substrate 200, and may have a same structure, so that an ion implantation process or an impurity diffusion process may form regions with the same type and concentration of dopant together. For example, 210c and 210d may have the same type and concentration of dopant, therefore, may be formed together; 220c and 220d may have the same type and concentration of dopant, therefore, may be formed together; and 240c and 240d may have the same type and concentration of dopant, therefore, may be formed together. Accordingly, the ESD protection circuit may be more easily formed.

According to example embodiments, a semiconductor device that includes an on-chip type ESD protection circuit may protect an internal circuit from an ESD surge at a low voltage region as well as a high voltage region with a high response speed. A dopant region of the junction diode may function as a guard ring for a schottky diode, and thus, the semiconductor device may provide an ESD protection circuit having an improved reverse characteristic of the diode pair as well as the forward characteristic.

The present invention includes the above mentioned embodiments and other various embodiments including the following:

1) A method of manufacturing a semiconductor device that comprises an on-chip type ESD protection circuit, the method comprising: providing a first conductive type region in a semiconductor substrate; providing a junction diode by forming a second conductive type region contacting with the first conductive type region; and providing a schottky diode by forming a metallic material layer on the first conductive type region.

2) The method according to 1) above, wherein the first conductive type is an N type, and the second conductive type is a P type.

3) The method according to 1) above, further comprising forming a highly doped second conductive type region in an upper portion of the second conductive type region after formation of the second conductive type region.

4) The method according to 3) above, wherein the formed metallic material layer extends over at least a portion of the second conductive type region.

5) The method according to 1) above, wherein the metallic material layer includes a metal or a silicide compound thereof.

6) The method according to 5) above, wherein the metal includes one of Mo, W, Co, Ni and an alloy thereof.

7) The method according to 1) above, further comprising doping the first conductive type region and doping the second conductive type region, wherein the dopant concentrations of the first conductive type region and the second conductive type region are determined from the operating range of the ESD protection circuit.

8) The method according to 1) above, wherein the junction diode is turned on at a forward voltage of about 0.6 to about 0.8 V, and the schottky diode is turned on at a forward voltage of about 0.2 to about 0.4 V.

While example embodiments have been particularly shown and described with reference to FIGS. 1-5B, it will be understood by those of ordinary skill in the art that various changes in form and details may be made therein without departing from the spirit and scope of example embodiments as defined by the following claims.

What is claimed is:

1. A semiconductor device including an on-chip type electrostatic discharge (ESD) protection circuit comprising:
   a first junction diode having a first conductive type region contacting a second conductive type region in a semiconductor substrate; and
   a first schottky diode having a metallic material layer arranged on and contacting the first conductive type region,
   wherein the first junction diode and the first schottky diode are connected in parallel,
   the ESD protection circuit is configured to pass current through the first schottky diode and the first junction diode at a forward voltage across the diodes of about a threshold voltage of the first junction diode, and
   a current driving capability of the first junction diode at high voltage is greater than a current driving capability of the first schottky diode.

2. The semiconductor device of claim 1, wherein the first conductive type is an N type, and the second conductive type is a P type.

3. The semiconductor device of claim 1, wherein the second conductive type region surrounds at least a portion of the first conductive type region in a depth direction of the semiconductor substrate to provide a guard ring for the schottky diode.

4. The semiconductor device of claim 3, wherein the second conductive type region includes a highly doped second conductive type region, a doping concentration of the highly doped second conductive type region greater than a doping concentration of the second conductive type region outside of the highly doped second conductive type region.

5. The semiconductor device of claim 4, wherein the metallic material layer extends over at least a portion of the highly doped second conductive type region, and
   the metallic material layer is in ohmic contact with the highly doped second conductive type region.

6. The semiconductor device of claim 1, wherein the first conductive type region includes a highly doped first conductive type region in an upper portion of the first conductive type region.

7. The semiconductor device of claim 1, wherein the metallic material layer includes one of a metal and a silicide compound thereof.

8. The semiconductor device of claim 7, wherein the metal includes one of Mo, W, Co, Ni and an alloy thereof.

9. The semiconductor device of claim 1, further comprising:
   a contact plug electrically connecting the schottky diode to one of a power line and an input/output signal terminal, the contact plug not overlapping a junction region of the first conductive type region and the metallic material layer.

10. The semiconductor device of claim 1, wherein the first conductive type region has a dopant concentration, the second conductive type region has a dopant concentration, the dopant concentrations of the first conductive type region and the second conductive type region are determined from the operating range of the ESD protection circuit.

11. The semiconductor device of claim 1, wherein the junction diode is turned on at the forward voltage of about 0.6 to about 0.8 V, and the schottky diode is turned on at the forward voltage of about 0.2 to about 0.4 V.

12. A semiconductor device that comprises an on-chip type ESD protection circuit, comprising:
   a first diode pair arranged in a first device region and including
      a first junction diode having a first conductive type region contacting a second conductive type region of the first device region in a semiconductor substrate, and
      a first schottky diode having a metallic material layer arranged on and contacting the first conductive type region of the first device region; and
   a second diode pair arranged in a second device region and including
      a second junction diode having a first conductive type region contacting a second conductive type region of the second device region in the semiconductor substrate, and
      a second schottky diode having a metallic material layer arranged on and contacting the first conductive type region of the second device region,
   wherein the first diode pair is connected in parallel,
   the first diode pair is configured to pass current through the first schottky diode and the first junction diode at a forward voltage across the first diode pair of about a threshold voltage of the first junction diode, and a current driving capability of the first junction diode at high voltage is greater than a current driving capability of the first schottky diode.

13. The semiconductor device of claim 12, wherein,
the first conductive type region of the first device region is an N type doped region, and the second conductive type region of the first device region is a P type doped region; and
the first conductive type region of the second device region is a P type doped region, and the second conductive type region of the second device region is an N type doped region.

14. The semiconductor device of claim 13, wherein
the first diode pair includes anodes electrically connected to an input/output signal terminal and cathodes electrically connected to a first power line; and
the second diode pair includes anodes electrically connected to a second power line and cathodes electrically connected to the input/output signal terminal.

15. The semiconductor device of claim 12, wherein,
the first conductive type region of the first device region is an N type doped region, and the second conductive type region of the first device region is a P type doped region; and
the first conductive type region of the second device region is an N type doped region, and the second conductive type region of the second device region is a P type doped region.

16. The semiconductor device of claim 15, wherein
the first diode pair includes anodes electrically connected to an input/output signal terminal and cathodes electrically connected a first power line, and
the second diode pair includes anodes electrically connected to a second power line and cathodes electrically connected to the input/output signal terminal.

17. The semiconductor device of claim 12, wherein
at least one of the second conductive type regions surrounds at least a portion of the corresponding first conductive type region in a depth direction of the semiconductor substrate to provide a guard ring for a corresponding schottky diode.

18. The semiconductor device of claim 12, wherein at least one of the first device region and the second device region includes a highly doped second conductive type region in an upper portion of the second conductive type region.

19. The semiconductor device of claim 18, wherein at least one of the metallic material layers of the first device region and the second device region extends over at least a portion of the corresponding highly doped second conductive type region.

20. The semiconductor device of claim 12, wherein at least one of the first device region and the second device region includes a highly doped first conductive type region in an upper portion of the first conductive type region.

21. The semiconductor device of claim 12, wherein at least one of the metallic material layers of the first device region and the second device region includes one of a metal and a silicide compound thereof.

22. The semiconductor device of claim 21, wherein the metal includes one of Mo, W, Co, Ni and an alloy thereof.

23. The semiconductor device of claim 12, further comprising:
a contact plug electrically connecting the schottky diode of at least one of the first and second device regions to one of a power line and an input/output signal terminal, the contact plug not overlapping a junction region of the first conductive type region and the metallic material layer.

24. The semiconductor device of claim 12, wherein the first junction diode is turned on at the forward voltage of about 0.6 to about 0.8V, and the first schottky diode is turned on at the forward voltage of about 0.2 to about 0.4V.

* * * * *